US007269094B2

(12) United States Patent
Lin et al.

(10) Patent No.: US 7,269,094 B2
(45) Date of Patent: Sep. 11, 2007

(54) MEMORY SYSTEM AND METHOD FOR STROBING DATA, COMMAND AND ADDRESS SIGNALS

(75) Inventors: Feng Lin, Boise, ID (US); Brent Keeth, Boise, ID (US); Brian Johnson, Boise, ID (US); Seong-hoon Lee, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/352,131

(22) Filed: Feb. 10, 2006

(65) Prior Publication Data

US 2006/0143491 A1 Jun. 29, 2006

Related U.S. Application Data

(62) Division of application No. 10/931,472, filed on Aug. 31, 2004, now Pat. No. 7,126,874.

(51) Int. Cl.
*G11C 8/00* (2006.01)
(52) U.S. Cl. .................. 365/233; 365/233.5; 365/193; 365/194; 365/191
(58) Field of Classification Search ................ 365/233, 365/233.5, 191, 193, 194
See application file for complete search history.

(56) References Cited

U.S. PATENT DOCUMENTS

| | | | |
|---|---|---|---|
| 4,238,841 A | 12/1980 | Clemen et al. .............. | 365/203 |
| 5,471,607 A | 11/1995 | Garde ......................... | 395/550 |
| 5,796,675 A | 8/1998 | Jang ....................... | 365/230.08 |
| 5,831,929 A | 11/1998 | Manning .................... | 365/233 |
| 5,896,347 A | 4/1999 | Tomita et al. .............. | 365/233 |
| 5,898,331 A | 4/1999 | Fujita .......................... | 327/296 |
| 5,959,935 A | 9/1999 | Pascucci ..................... | 365/233 |
| 5,974,499 A | 10/1999 | Norman et al. ............. | 711/103 |
| 6,026,050 A | 2/2000 | Baker et al. ................ | 365/233 |
| 6,073,204 A | 6/2000 | Lakhani et al. ............ | 711/100 |
| 6,111,446 A | 8/2000 | Keeth ......................... | 327/258 |
| 6,167,495 A | 12/2000 | Keeth et al. ................ | 711/167 |
| 6,173,432 B1 | 1/2001 | Harrison ........................ | 716/1 |
| 6,243,797 B1 | 6/2001 | Merritt ....................... | 711/167 |
| 6,279,090 B1 | 8/2001 | Manning .................... | 711/167 |
| 6,316,976 B1 | 11/2001 | Miller, Jr. et al. .......... | 327/156 |

(Continued)

FOREIGN PATENT DOCUMENTS

KR   2001-004018   1/2001

*Primary Examiner*—Viet Q. Nguyen
(74) *Attorney, Agent, or Firm*—Dorsey & Whitney, LLP

(57) ABSTRACT

A memory system couples command, address or write data signals from a memory controller to a memory device and read data signals from the memory device to the memory controller. A respective strobe generator circuit in each of the memory controller and the memory device each generates an in-phase strobe signal and a quadrature strobe signal. Command, address or write data signals stored in respective output latches in the memory controller are clocked by the in-phase signals from the internal strobe generator circuit. These command, address or write data signals are latched into input latches in the memory device by the quadrature strobe signal coupled from the memory controller to the memory device. In substantially the same manner, read data signals are coupled from the memory device to the memory controller using the in-phase and quadrature strobe signals generated by the internal strobe generator circuit.

3 Claims, 4 Drawing Sheets

U.S. PATENT DOCUMENTS

| | | | |
|---|---|---|---|
| 6,330,200 B2 | 12/2001 | Ooishi | 365/201 |
| 6,330,650 B1 | 12/2001 | Toda et al. | 711/167 |
| 6,338,127 B1 | 1/2002 | Manning | 711/167 |
| 6,359,481 B1 | 3/2002 | Kim | 327/141 |
| 6,385,709 B2 | 5/2002 | Merritt | 711/167 |
| 6,397,312 B1 | 5/2002 | Nakano et al. | 711/167 |
| 6,487,141 B2 | 11/2002 | Martin | 365/233 |
| 6,509,762 B1 | 1/2003 | Moss et al. | 327/12 |
| 6,518,794 B2 | 2/2003 | Coteus et al. | 326/93 |
| 6,522,598 B2 | 2/2003 | Ooishi | 365/233 |
| 6,560,661 B2 | 5/2003 | Toda et al. | 710/61 |
| 6,567,335 B1 | 5/2003 | Norman et al. | 365/230.06 |
| 6,570,815 B2 | 5/2003 | Kashiwazaki | 365/233 |
| 6,570,944 B2 | 5/2003 | Best et al. | 375/355 |
| 6,600,681 B1 | 7/2003 | Korger et al. | 365/193 |
| 6,603,686 B2 | 8/2003 | Yoo et al. | 365/193 |
| 6,646,929 B1 | 11/2003 | Moss et al. | 365/194 |
| 6,707,723 B2 | 3/2004 | Jeong | 365/189.05 |
| 6,760,263 B2 | 7/2004 | Liou | 365/193 |
| 6,774,690 B2 * | 8/2004 | Baker et al. | 327/158 |
| 6,775,190 B2 | 8/2004 | Setogawa | 365/193 |
| 6,807,613 B1 | 10/2004 | Keeth et al. | 711/167 |
| 6,836,503 B2 | 12/2004 | Best et al. | 375/35 |
| 6,918,046 B2 | 7/2005 | Park et al. | 713/400 |
| 6,940,768 B2 | 9/2005 | Dahlberg et al. | 365/201 |
| 6,965,923 B2 | 11/2005 | Norman et al. | 709/214 |
| 7,003,686 B2 * | 2/2006 | Chua-Eoan et al. | 713/600 |
| 7,042,260 B2 | 5/2006 | Choi | 327/156 |
| 7,046,056 B2 * | 5/2006 | Kizer et al. | 327/147 |
| 7,126,874 B2 * | 10/2006 | Lin et al. | 365/233 |
| 7,187,617 B2 * | 3/2007 | Lin et al. | 365/230.06 |
| 2005/0138456 A1 | 6/2005 | Song | 713/400 |
| 2006/0049891 A1 | 3/2006 | Crete | 333/99 S |

* cited by examiner

MEMORY SYSTEM AND METHOD FOR STROBING DATA, COMMAND AND ADDRESS SIGNALS

CROSS-REFERENCE TO RELATED APPLICATION

This application is a divisional of U.S. patent application Ser. No. 10/931,472, filed Aug. 31, 2004, now U.S. Pat. No. 7,126,874.

TECHNICAL FIELD

This invention relates to memory system and methods, and, more particularly, to a system and method for accurately latching data, command and address signals coupled between a memory controller and a memory device.

BACKGROUND OF THE INVENTION

Command, address and write data signals are typically coupled from a memory controller or other device to memory devices, such as synchronous random access memory ("SDRAM") devices. These command, address and write data signals are typically transmitted in synchronism with a system clock signal. Similarly, read data signals are typically coupled from memory devices to a memory controller or other device in synchronism with the system clock signal. In some cases, the memory devices or memory controller may couple a strobe signal between the memory devices and memory controller along with the command, address and data signals. The system clock signal or strobe signal derived from the system clock signal is used to "capture" the command, address and data signals by clocking latches that store the command, address and data signals. The advantage of coupling a strobe signal between the memory devices and memory controller is that it will be affected by signal skews and propagation delays in the same manner that with the command, address and data signals with which it is transmitted will be affected.

The transitions of the system clock signal are typically substantially aligned with transitions of the command, address and data signals. Similarly, the transitions of a received strobe signal are typically substantially aligned with transitions of the command, address and data signals. During the period between these transitions, the command, address and data signals are "valid," and it is during this valid period, known as an "eye," that the command, address and data signals must be captured. The system clock signal or received strobe signal normally cannot be used to directly capture command, address and data signals because the transitions of the system clock signal or received strobe signal substantially coincide with the transitions of the command, address and data signals rather than the eye between those transitions. As a result, a quadrature strobe signal that is delayed from the system clock or received strobe signal by 90 degrees must be generated from the system clock signal or received strobe signal. The quadrature strobe signal can latch the command, address and write data signals into the memory device at the center of the "eye" in which the command, address or data signals are valid.

Various techniques have been used to generate a quadrature strobe signal in a memory device or memory controller based on a system clock signal. If the frequency of the system clock signal is fixed, a quadrature strobe signal can be generated by a timing circuit that simply generates a transition of the strobe signal a fixed time after a corresponding transition of the system clock signal. However, synchronous memory devices are typically designed and sold to be operated over a wide range of system clock frequencies. Therefore, it is generally not practical to use a fixed timing circuit to generate a quadrature strobe signal from the system clock signal. Instead, as a practical matter, a circuit that can adapt itself to a system clock signal having a range of frequencies must be used.

One technique that has been used to ensure the correct timing of a strobe signal relative to captured digital signals is to use a closed loop circuit, such as a phase-lock loop ("PLL") or delay-lock loop ("DLL"), to generate the quadrature strobe signal. In particular, a closed loop circuit allows the timing of the strobe signal to be adjusted to minimize the phase error between the quadrature strobe signal and the valid eye of the digital signal. Although these closed loop circuits can accurately generate a quadrature strobe signal based on the system clock signal over a substantial range of frequencies of the system clock signal, they are not without their limitations. For example, the propagation delays of the command, address and data signals coupled between a memory controller and a memory device may vary to such an extent that a quadrature strobe signal generated from the system clock can no longer capture these signals during their valid period or eye. A quadrature strobe signal that is generated from a strobe signal coupled from the memory controller or memory device with the transmitted the command, address or data signals can better track variations in the propagation times of the command, address or data signals. However, the phase of the quadrature strobe signal generated from the strobe signal coupled with the transmitted command, address or data signals may not adequately track variations in the propagation times of the transmitted command, address or data signals. The quadrature strobe signal may be further delayed relative to the command, address or data signals in coupling the quadrature strobe from the closed loop circuit generating the strobe signal to a latch that will be used to capture the transmitted command, address or data signals. Therefore, even a quadrature strobe signal generated from a strobe signal transmitted with the command, address or data signals may fail to capture these signals during their valid period or eye. As the speed of memory devices continues to increase, the "eye" during which the command, address and data signals must be captured becomes smaller and smaller, thus making the timing of the quadrature strobe signal even more critical. Capturing command, address and data signals during the eye becomes even more difficult in memory devices and memory controllers in which several bits of data are serially coupled from an external terminal each clock period.

There is therefore a need for a system and method for more precisely capturing transmitted command, address and data signals during their eye or valid period, particularly where multiple bits of a command, address or data are transmitted during each clock period.

SUMMARY OF THE INVENTION

This invention is directed to a method and system for coupling a command, address or data signal between a memory controller and a memory device. An in-phase strobe signal and a quadrature strobe signal are generated in either the memory controller or memory device. The quadrature strobe signal has signal transitions that are offset from signal transitions of the in-phase strobe signal by 90 degrees. A command, address or data bit is coupled from the device in which the in-phase strobe signal and a quadrature strobe signal were generated, i.e., either the memory controller or memory device, by clocking the command, address or data bit out of the device responsive to a transition of the in-phase strobe signal. The quadrature strobe signal is coupled to the device in which the in-phase strobe signal and a quadrature strobe signal were not generated and used to capture the command, address or data bit at that device responsive to a transition of the quadrature strobe signal.

DETAILED DESCRIPTION

Figure 1:
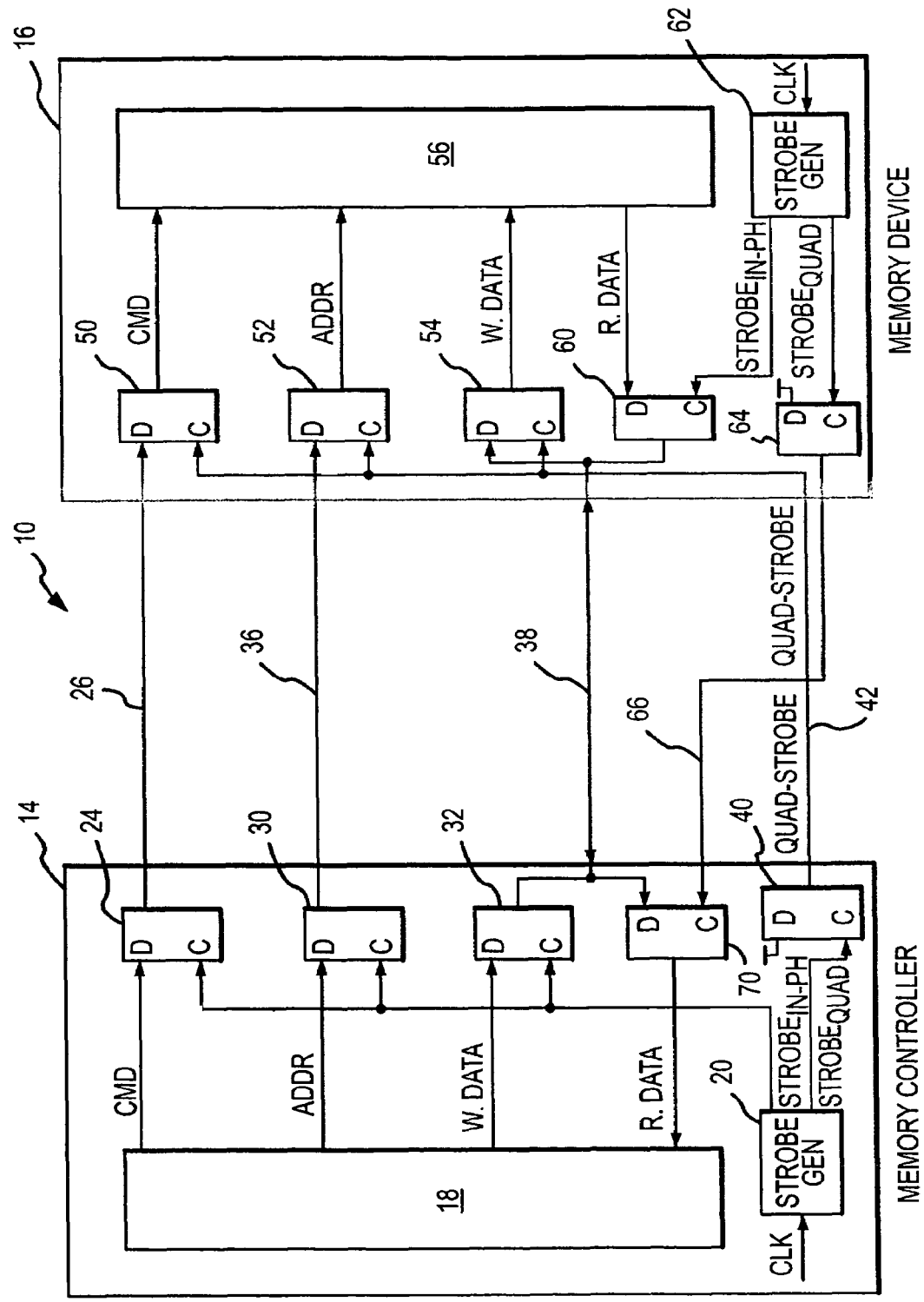
FIG. 1 is a block diagram of a memory system according to one embodiment of the invention.

A memory system 10 according to one embodiment of the invention is shown in FIG. 1. The memory system includes a memory controller 14 coupled to a memory device 16, such as a synchronous dynamic random access memory ("SDRAM"). In addition to the components normally found in a conventional memory controller, which are designated by the reference numeral 18, the memory controller 14 includes a strobe signal generating circuit 20 that generates an in-phase strobe signals $STROBE_{IN-PH}$ and a quadrature strobe signal $STROBE_{QUAD}$ from a system clock signal CLK. The $STROBE_{IN-PH}$ signal is substantially in phase with the CLK signal while the $STROBE_{QUAD}$ is delayed substantially 90 degrees from the CLK signal. Although the CLK signal is a continuous free-running signal, the $STROBE_{IN-PH}$ signal and the $STROBE_{QUAD}$ signal are generated from the CLK signal only when command, addresses or write data are being coupled from the memory controller 14.

The $STROBE_{IN-PH}$ signal is coupled to the clock input of a plurality of command latches 24 each of which receives a bit of a memory command from the memory controller circuitry 18. The command latches 24 output the command bits on a command bus 26 responsive to each rising edge transition of the $STROBE_{IN-PH}$ signal. Similarly, The $STROBE_{IN-PH}$ signal is coupled to the clock input of a plurality of address latches 30 and to the clock input of a plurality of write data latches 32. Each of the address latches 30 receives a bit of a memory address from the memory controller circuitry 18, and each of the write data latches 32 receives a bit of write data from the memory controller circuitry 18. The address latches 30 output the address bits on an address bus 36 responsive to each rising edge transition of the $STROBE_{IN-PH}$ signal, and the write data latches 32 output the write data bits on a data bus 38 responsive to each rising edge transition and each falling edge transition of the $STROBE_{IN-PH}$ signal. The $STROBE_{QUAD}$ signal from the strobe signal generating circuit 20 is coupled to a clock input of a pair of strobe signal latches 40 (only one of which is shown in FIG. 1). One of the latches 40 has its data input coupled to $V_{CC}$, and it is clocked on the rising edge of the $STROBE_{QUAD}$ signal. The other of the latches 40 has its data input coupled to ground, and it is clocked on the falling edge of the $STROBE_{QUAD}$ signal. The outputs of both latches 40 are coupled to each other so that the QUAD-STROBE signal toggles between high and low in correspondence to the $STROBE_{QUAD}$ signal.

Although FIG. 1 shows a single $STROBE_{IN-PH}$ signal being coupled to all of the latches 24, 30, 32, it will be understood that separate, respective $STROBE_{IN-PH}$ signals may be coupled to the latches 24, 30, 32, and that these separate $STROBE_{IN-PH}$ signals need not be all active at the same time. Instead, the $STROBE_{IN-PH}$ signals may be coupled to the latch 24 only when command signals are to being transmitted from the memory controller 14, the $STROBE_{IN-PH}$ signals may be coupled to the latch 30 only when address signals are to being transmitted from the memory controller 14, and the $STROBE_{IN-PH}$ signals may be coupled to the latch 32 only when write data are to being transmitted from the memory controller 14.

The command bus 26, address bus 36, and data bus 38 42 are coupled to corresponding buses of the memory device 16. More specifically, the bits of the command bus 26 are coupled to the data input of respective command latches 50, the bits of the address bus 36 are coupled to the data input of respective address latches 52, and the bits of the data bus 38 are coupled to the data input of respective write data latches 54. The QUAD-STROBE signal from the latch 40 is coupled to the memory device 16 along with the command, address and write data signals, and, because it is coupled from the same type of latch, it has the same timing as those signals. The QUAD-STROBE signal is coupled to the clock input of the latches 50, 52, 54 to capture the command bits, address bits and write data bits, respectively. The latches 50, 52 capture command and address signals, respectively, on the rising edge of the QUAD-STROBE signal, and the latch 54 captures write data signals on both the rising edge and the falling edges of the QUAD-STROBE signal. The captured command bits from the command latches 50, the captured address bits from the address latches 52 and the captured write data bits from the write data latches 54 are coupled to circuitry found in conventional memory devices, which is designated by reference numeral 56. This memory device circuitry 56 typically includes a row address circuit that receives and decodes row address signals applied to external address terminals of the memory device 16, and a column address circuit that receives and decodes column address signals applied to the external address terminals of the memory device 16. The memory device circuitry 56 also includes one or more memory cell arrays that store data written to or read from the array at a location determined by the decoded row address signals and the decoded column address signals. A data path circuit couples read data signals corresponding to the data from the array to data bus terminals of the memory device 16, and write data signals corresponding to the data from the data bus terminals of the memory device 16 to the array. Finally, a command decoder included in the memory device circuitry 56 decodes a plurality of command signals applied to respective external command terminals of the memory device 16 to control the operation of the memory device.

Significantly, the QUAD-STROBE signal transmitted on the strobe signal line 42 has transitions that occurs at the approximate midpoint of when the command, address and write data bits are valid. As a result, the command, address and write data bits can be captured during their eye or valid period. In particular, any variation in the propagation times of the command, address, and write data signals will be matched by variations in the propagation times of the QUAD-STROBE signal since the QUAD-STROBE signal is transmitted from the memory controller 14 to the memory device 16 along with the command, address and write data bits and in the same manner. Further, the QUAD-STROBE signal is not generated by processing the CLK signal or a received strobe signal, such as the $STROBE_{IN-PH}$ signal, so that the QUAD-STROBE signal is not subjected to delays to which the command, address and write data signals are not subjected. As a result, the QUAD-STROBE signal can accurately capture the command, address and write data signals even at very high operating speeds of the memory system 10.

With further reference to FIG. 1, the memory circuitry 56 in the memory device 16 outputs read data signals responsive to memory requests from the memory controller 14. Bits of the read data are coupled to the data input of respective read data latches 60. The memory device 16 also includes a strobe generating circuit 62, which may be identical to the strobe generating circuit 20 in the memory controller 14. The strobe generating circuit 62 generates an in-phase strobe signal $STROBE_{IN-PH}$ and a quadrature strobe signal $STROBE_{QUAD}$ from the system clock signal CLK. The $STROBE_{IN-PH}$ is substantially in phase with the CLK signal while the $STROBE_{QUAD}$ is delayed substantially 90 degrees from the CLK signal. The $STROBE_{IN-PH}$ signal is coupled to the clock inputs of the read data latches 60 so that the bits of read data are coupled to the data bus 38 responsive to rising and falling edge transitions of the $STROBE_{IN-PH}$ signal. The $STROBE_{QUAD}$ signal from the strobe signal generating circuit 62 is coupled to the clock input of a pair of strobe signal latches 64 (only one of which is shown in FIG. 1), one of which has its data input coupled to $V_{CC}$ and the other of which has its data input coupled to ground. The outputs of the latches 64 are coupled to each other so the strobe signal latch 64 generates a QUAD-STROBE signal that follows the $STROBE_{QUAD}$ signal, and the QUAD-STROBE signal is coupled to the memory controller 14 through a strobe signal line 66.

The memory controller 14 further includes read data latches 70 that have their data inputs coupled to the data bus 38. The clock inputs of the read data latches 70 are coupled to the strobe signal line 66 to receive the QUAD-STROBE signal from the memory device 16. The QUAD-STROBE signal captures the bits of the read data in the read data latches 70 in the same manner and with the same advantages obtained in using the QUAD-STROBE signal from the memory controller 14 to capture the command, address and write data bits in the memory device 16, as explained above. The captured read data bits are then coupled from the read data latches 70 to the memory controller circuitry 18.

Although the memory system 10 shown in FIG. 1 uses respective QUAD-STROBE signals coupled from both the memory controller 14 and the memory device 16, it should be understood that such is not necessary. Instead, a QUAD-STROBE signal can be coupled from only the memory controller 14 and used to capture command, address and write data bits, or from only the memory device 16 and used to capture read data bits. Further, in the event multiple memory devices 16 are used in a memory system, a single QUAD-STROBE signal may be used for all of the memory devices, or a respective QUAD-STROBE signal may be coupled to the memory controller 14 from each of the memory devices 16. Alternatively, respective QUAD-STROBE signal from each of the memory devices 16 may be combined into a single QUAD-STROBE signal that is coupled to the memory controller 14. Finally, although the command, address and data signals are transmitted from either the memory controller 14 or the memory device 16 responsive to a $STROBE_{IN-PH}$ signal and captured in the the memory device 16 or memory controller 14, respectively, responsive to the $STROBE_{QUAD}$ signal, the $STROBE_{IN-PH}$ and $STROBE_{QUAD}$ signals may be used in the reverse manner. Specifically, the command, address and data signals may be transmitted from either the memory controller 14 or the memory device 16 responsive to the $STROBE_{QUAD}$ signal and captured in the memory device 16 or memory controller 14, respectively, responsive to the $STROBE_{IN-PH}$ signal. Other variations will be apparent to one skilled in the art.

The memory system 10 of FIG. 1 couples a single bit on each line of the command bus 26, address bus 36 and data bus 38 each period of the system clock signal CLK. In another embodiment shown in FIG. 2, a memory system 80 couples a single bit on each line of the command bus 26 and the address bus 36 each period of the system clock signal CLK. However, to increase the data bandwidth of the memory system 80, the memory system 80 couples several bits of data on each line of the data bus 38 each period of the system clock signal CLK. The memory system 80 uses many of the same components that are used in the memory system 10 of FIG. 1. Therefore, in the interest of brevity, these same components are provided with the same references numerals, and an explanation of their structure and operation will not be repeated.

The memory system 80 differs from the memory system 10 of FIG. 1 by using strobe generator circuits 82, 84 in a memory controller 86 and memory device 88, respectively, that generate four $STROBE_{IN-PH}$ signals and four $STROBE_{QUAD}$ signals every two consecutive periods of the CLK signal. These four $STROBE_{IN-PH}$ signals and four $STROBE_{QUAD}$ signals can each be either four strobe pulses generated on respective single output lines or, if the rising and falling edges are used, four $STROBE_{IN-PH}$ pulses and four $STROBE_{QUAD}$ pulses generated on respective sets of four separate lines. However, to minimize duty cycle distortion, the four $STROBE_{IN-PH}$ signals and the four $STROBE_{QUAD}$ signals are each separate strobe pulses output from the strobe generators 82, 84 on respective lines. The latched write data bits are then sequentially coupled to a respective line of the data bus 38 responsive to respective ones of the four $STROBE_{IN-PH}$ signals. Thus, four sequentially transmitted write data bits are sequentially coupled to the memory device 88 every two consecutive periods of the system clock signal along with the four QUAD-STROBE signals sequentially generated from the respective $STROBE_{QUAD}$ signals by a strobe signal latch 91.

At the memory device 88, the four sequentially transmitted write data bits are applied to the data input of a write data latch 92, which receives the four sequentially transmitted QUAD-STROBE signals from the strobe signal latch 91 in the memory controller 86 at a clock input. As each QUAD-STROBE pulse transitions high, the write data bit being coupled to the data input of the write data latch 92 is captured in the latch 92. At the end of each two consecutive clock periods, four write data bits stored in the latch 92 are coupled in parallel to the memory device circuitry 56.

In a similar manner, the strobe generator circuit 84 in the memory device 88, generates four $STROBE_{IN-PH}$ signals and four $STROBE_{QUAD}$ signals every two consecutive periods of the CLK signal. Four read data bits from the memory device circuitry 56 are latched into a read data latch 94 in parallel every two consecutive periods of the CLK signal. The latched read data bits are then sequentially coupled to a respective line of the data bus 38 responsive to respective STROBE$_{IN-PH}$ signals, which are also generated by the strobe generator circuit 84. The four STROBE$_{QUAD}$ signals generated by the strobe generator circuit 84 are also coupled to respective clock inputs of a strobe signal latch 96, which sequentially outputs four QUAD-STROBE signals every two consecutive clock cycles that are coupled to the memory controller 86. The transmitted read data bits are applied to the data input of the read data latch 90 and captured in the latch 90 responsive to the four QUAD-STROBE signals sequentially transmitted from the latch 96, which are applied to respective clock inputs. At the end of two consecutive CLK periods, four bits of read data are coupled from the read data latch 90 to the memory controller circuitry 18 in parallel.

Figure 3:
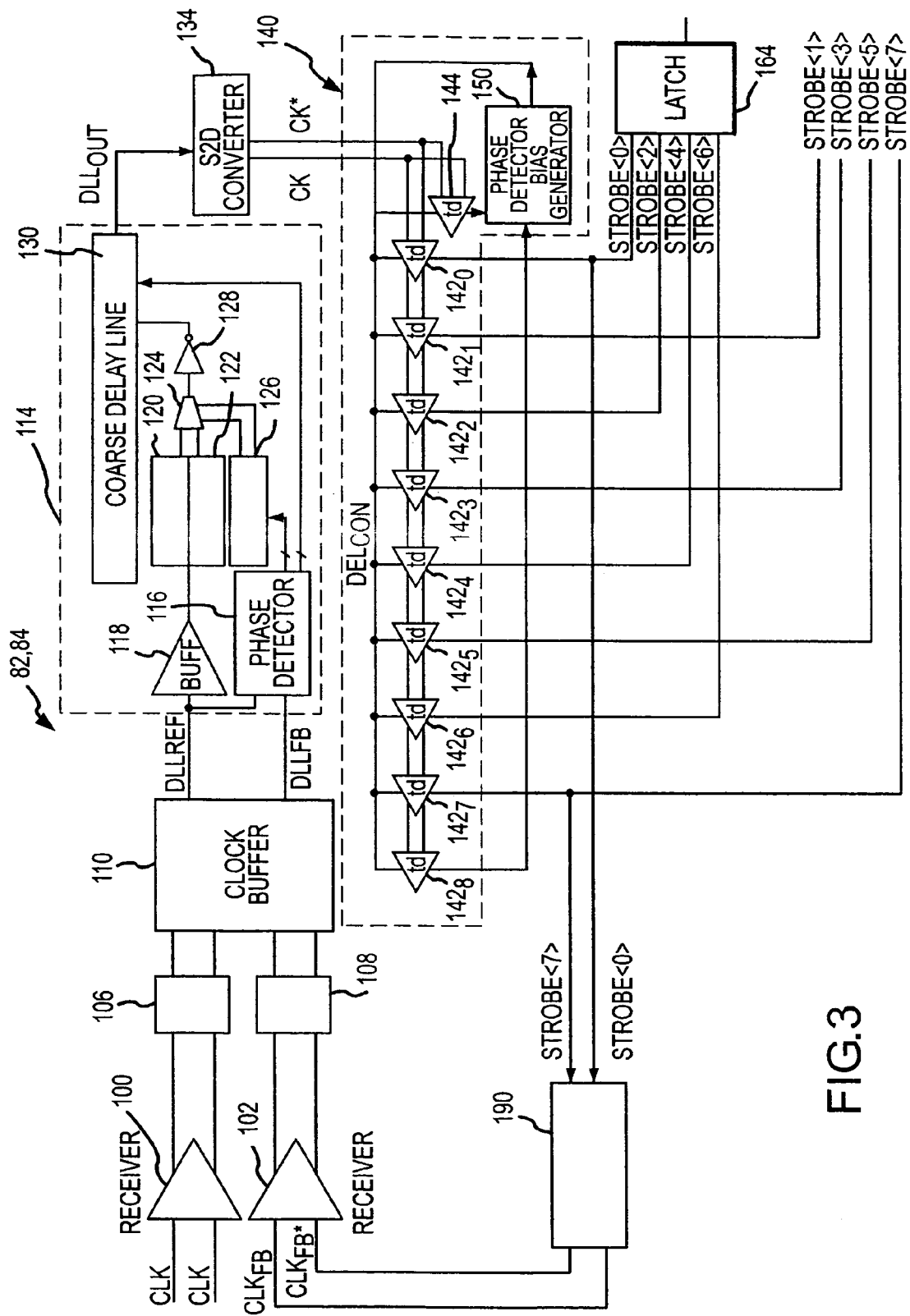
FIG. 3 is a block diagram of a strobe generator circuit that can be used in the memory systems shown in FIGS. 1 and 2.

One embodiment of the strobe generator circuits 82, 84, as well as the read data latches 94 and the write data latches 92 is shown in FIG. 3. The CLK signal and its compliment CLK* are coupled to the strobe generator circuits 82, 84 where they are applied to a receiver 100. A similar receiver 102 receives a feedback clock signal CLK$_{FB}$ and its compliment CLK$_{FB}$* in a manner that will be described below. The receivers 100, 102 apply their clock signals to respective clock dividers 106, 108, which generate, respectively, at the output of a clock buffer 110 a single delay line reference clock signal DLL$_{REF}$ having a frequency of one-half the frequency of the CLK signal and a single delay line feedback clock signal DLL$_{FB}$ having a frequency of one-half the frequency of the CLK$_{FB}$ signal. The clock dividers 106, 108 lower the frequency of the signals in the downstream components of the strobe generator circuits 82, 84 thereby extending the operating range, especially for high-speed operation. The DLL$_{REF}$ and DLL$_{FB}$ signals are applied to a delay-lock loop 114. As explained in greater detail below, the DLL$_{FB}$ signal is derived from a signal generated at the output of the delay-lock loop 114. The delay-lock loop 114 delays the DLL$_{REF}$ to produce the output signal by a delay that causes the DLL$_{REF}$ and DLL$_{FB}$ signals to have substantially the same phase.

The delay-lock loop 114 includes a phase detector 116 that compares the phase of the DLL$_{REF}$ signal to the phase of the DLL$_{FB}$ signal and generates an output signal corresponding to the phase difference. The DLL$_{REF}$ signal is also coupled through a buffer 118 to two fine delay paths 120, 122 each of which delays the DLL$_{REF}$ signal by a different magnitude of delay. The outputs of the fine delay paths 120, 122 are coupled to the inputs of a multiplexer 124, which is controlled by a fine delay control circuit 126 based on a control signal from the phase detector 116. The fine delay control circuit 126 causes an output from one of the delay paths 120, 122 to be coupled through an inverter 128 to a coarse delay line 130, which, in the embodiment shown in FIG. 3, has 20 delay stages. A coarse select signal CS from the phase detector 116 selects the number of delay stages though which the signal at the output of the inverter 128 will pass before being output from the coarse delay line 130 as a DLL$_{OUT}$ signal. As mentioned above, the DLL$_{FB}$ signal is derived from the DLL$_{OUT}$ signal, and the phase of the DLL$_{FB}$ signal changes in the same manner as the phase of the DLL$_{OUT}$ signal.

In operation, any difference in the phases of the DLL$_{REF}$ and DLL$_{FB}$ signals causes the phase detector 116 to output a CS signal that alters the number of stages of the coarse delay line 130 through which the signal at the output of the inverter 128 passes. More specifically, if the phase of the DLL$_{FB}$ signal lags the phase of the DLL$_{REF}$ signal, the number of stages of the coarse delay line 130 will be reduced, thereby increasing the phase of the DLL$_{FB}$ signal. Conversely, if the phase of the DLL$_{FB}$ signal leads the phase of the DLL$_{REF}$ signal, the number of stages of the coarse delay line 130 will be increased, thereby decreasing the phase of the DLL$_{FB}$ signal. To further reduce the phase difference between the DLL$_{REF}$ and DLL$_{FB}$ signals, the fine delay control circuit 126 selects the fine delay path 120, 122 that results in the minimum phase difference. It should be understood that other conventional or hereinafter developed delays lines, or other closed loop circuits like phase-lock loops, may be used in place of the delay-lock loop 114 shown in FIG. 3.

The DLL$_{OUT}$ signal is coupled from the coarse delay line 130 to a single to double clock circuit 134, which generates a clock circuit CK and its compliment CK* from the CLL$_{OUT}$ signal. These CK and CK* signals are coupled to a phase generator circuit 140, which generates multiple clock signals having respective phases of the CK signal.

The phase generator circuit 140 includes 9 delay circuits $142_0$-$142_8$ coupled in series with each other. The delay circuits $142_0$-$142_8$ generate respective output signals STROBE<0>-STROBE<8> that are each delayed from a signal applied to its input by a magnitude determined by a delay control signal DEL$_{CON}$. The STROBE<0> signal is also generated by a delay circuit 144. The STROBE<0> signal from the delay circuit 144 is applied to one input of a phase detector and control circuit 150, which also receives the STROBE<8> signal from the delay circuit $142_8$. The phase detector and control circuit 150 compares the phase of the STROBE<0> signal to the phase of the STROBE<8> signal and adjusts the magnitude of the DEL$_{CON}$ signal so that the phases of the STROBE<0> and STROBE<8> signals are equal to each other. As a result, the phases of the STROBE<1>-STROBE<7> signals are equally spaced from each other. More specifically, the phases of the STROBE<0>-STROBE<7> signals are as shown in Table 1 below:

TABLE 1

| Signal | Phase (Degrees) |
|---|---|
| STROBE<0> | 0 |
| STROBE<1> | 45 |
| STROBE<2> | 90 |
| STROBE<3> | 135 |
| STROBE<4> | 180 |
| STROBE<5> | 225 |
| STROBE<6> | 270 |
| STROBE<7> | 315 |

However, it should be understood that the 45 degree phase of the STROBE<1> signal is 45 degrees of the clock signals at the output of the clock dividers 106, 108, which is 90 degrees of the clock signals at the output of the receivers 100, 102. A similar relationship exists with respect to all of the other signals STROBE<2>-STROBE<7>. The STROBE<0>-STROBE<7> signals are coupled through a clock distribution network known as a clock tree. The in-phase STROBE signals, i.e., STROBE<0>, STROBE<2>, STROBE<4>, STROBE<6> are coupled to clock inputs of data latches 164 each of which receive 4 bits of data in parallel. The quadrature STROBE signals, i.e., STROBE<1>, STROBE<3>, STROBE<5>, STROBE<7> are transmitted along with the data bits from the data latches 164. The data latches 164 used in the memory controller 86 (FIG. 2) receive four parallel bits of write data and sequentially transmit the four write data bits responsive to the rising edges of the respective in-phase STROBE signals. These write data bits are transmitted to the memory device 88 along with the quadrature STROBE signals generated in the memory controller 86. Similarly, the data latches 164 used in the memory device 88 receive four parallel bits of read data and sequentially transmit the four read data bits responsive to the rising edges of the respective in-phase STROBE signals. These read data bits are transmitted to the memory controller 86 along with the quadrature STROBE signals generated in the memory device 88. Using half-frequency four strobe phases to clock the data latches 164 and data latches in the memory device 88 help maintain duty-cycle information and reduce intersymbol interference ("ISI") for the output latches 164 and the output latches in the memory device 88.

One or more of the STROBE<0>-STROBE<7> signals are coupled to a serializer circuit 190 that converts the received STROBE<0>-STROBE<7> signals to a feedback signal having twice the frequency of the STROBE signals. The serializer circuit 190 also preferably delays the feedback signal by a delay commensurate with the propagation delay from the data latches 164 to data bus terminals of the memory controller 86 and memory device 88.

The use of the delay-lock loop 114 and the phase generator circuit 140 in the strobe generator circuits 82, 84 has the advantage of generating strobe signals at several phases of the $DLL_{REF}$ clock signal while allowing the delay-lock loop 114 to operate at the relatively low frequency of the $DLL_{REF}$ clock signal. In contrast, if a phase-lock loop was used to generate strobe signals at several phases of the $DLL_{REF}$ clock signal it would be necessary for the phase-lock loop to generate a clock signal having a substantially higher frequency. For Example, for strobe signals to be generated that transition at the 45, 90, 135, 180, 225, 270 and 315 degree phases of a 500 MHz clock signal, it would be necessary for a phase lock loop to generate a clock signal having a frequency of at least 2 GHz. It can be difficult to design phase-lock loops operating at very high frequencies, and, in any case, a phase lock-loop operating at a high frequency uses substantially more power compared to a phase-lock loop or delay-lock loop operating at a substantially lower frequency.

Figure 2:
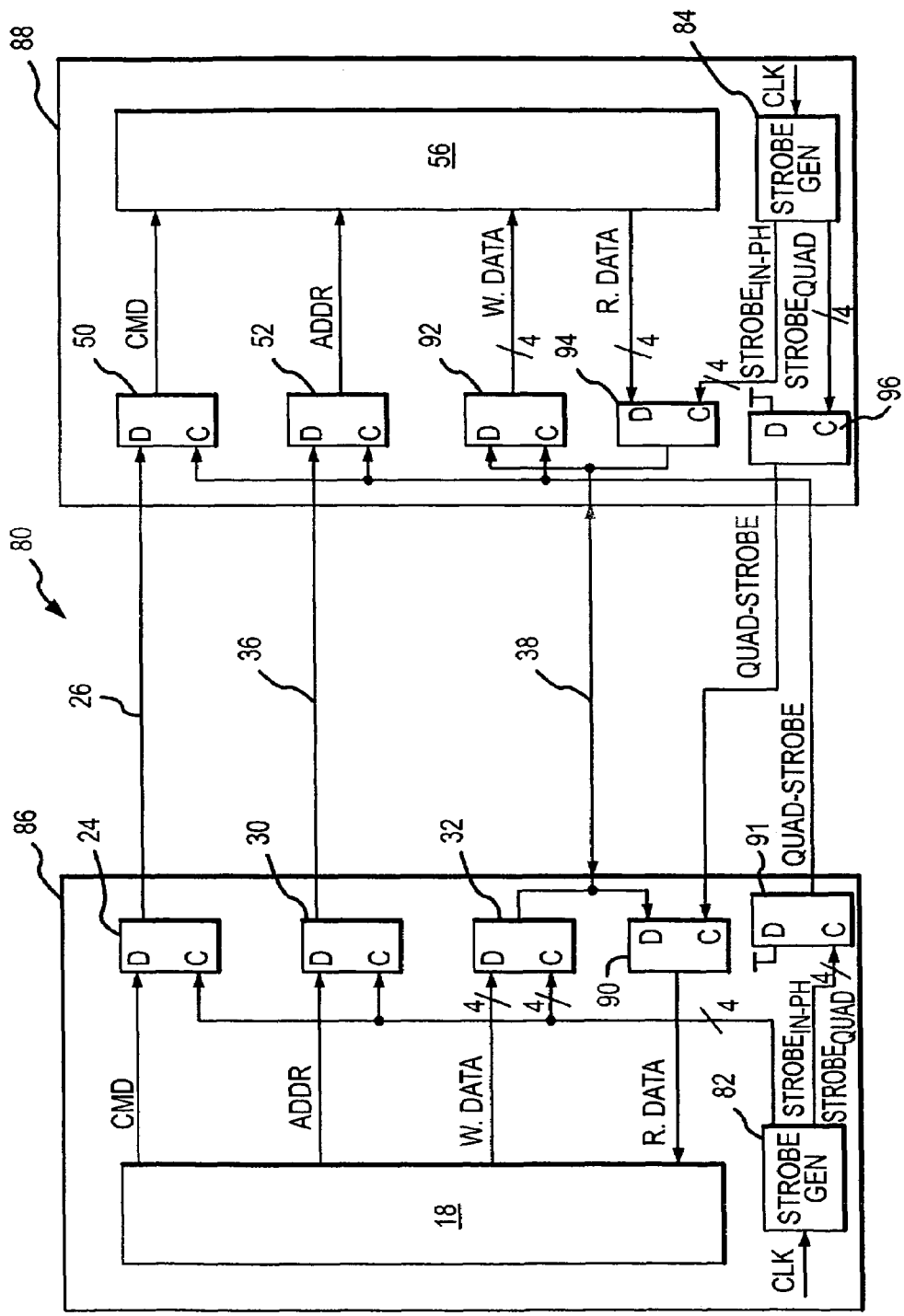
FIG. 2 is a block diagram of a memory system according to another embodiment of the invention in which several bits of data are transmitted through a data bus on each cycle of a system clock.
Figure 4:
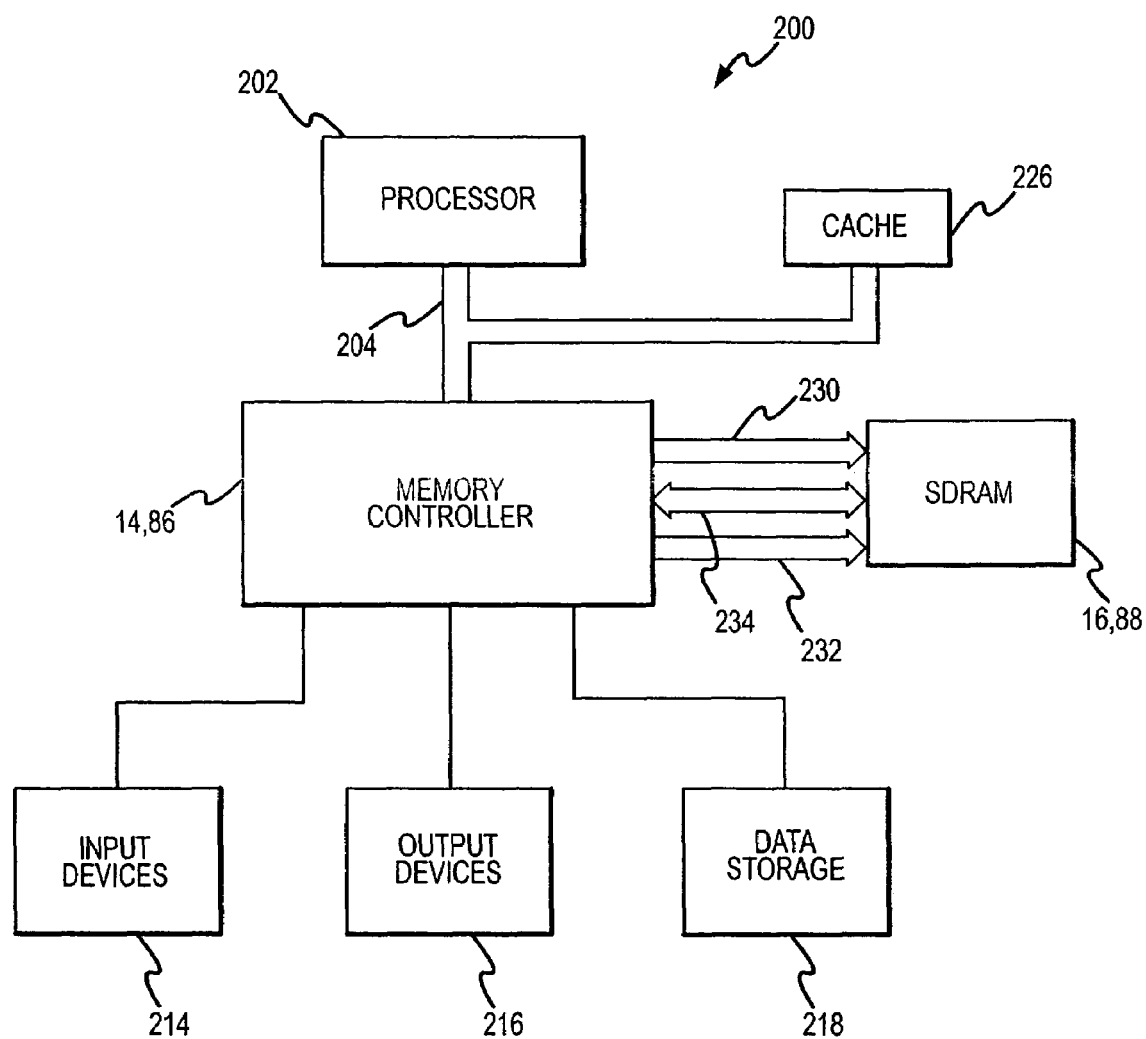
FIG. 4 is a block diagram of a computer system using the memory system of FIGS. 1 or 2.

The memory systems 10, 80 shown in FIGS. 1 and 2, respectively, or some other embodiment of a memory system according to the present invention can advantageously be used in processor-based systems, such as a computer system 200 shown in FIG. 4. The computer system 200 includes a processor 202 for performing various computing functions, such as executing specific software to perform specific calculations or tasks. The processor 202 includes a processor bus 204 that normally includes an address bus, a control bus, and a data bus. In addition, the computer system 200 includes one or more input devices 214, such as a keyboard or a mouse, coupled to the processor 202 to allow an operator to interface with the computer system 200. Typically, the computer system 200 also includes one or more output devices 216 coupled to the processor 202, such output devices typically being a printer or a video terminal. One or more data storage devices 218 are also typically coupled to the processor 202 to store data or retrieve data from external storage media (not shown). Examples of typical storage devices 218 include hard and floppy disks, tape cassettes, and compact disk read-only memories (CD-ROMs). The processor 202 is also typically coupled to a cache memory 226, which is usually static random access memory ("SRAM") and to the memory device 16 (FIG. 1), 88 (FIG. 2) through the memory controller 14 (FIG. 1), 86 (FIG. 2). The computer system 200 includes an address bus 230 to couple row addresses and column addresses from the memory controller 14, 86 to the memory device 16, 88. The computer system 200 also includes a command bus that couples command signals from the memory controller 14, 86 to the memory device 16, 88. Finally, the computer system 200 includes a data bus 234 that couples write data signals from the memory controller 14, 86 to the memory device 16, 88 and read data signals from the memory device 16, 88 to the memory controller 14, 86. As explained above, one or more of the signals coupled between the memory controller 14, 86 and the memory device 16, 88 are coupled using in-phase and quadrature strobe signals, which are also coupled between the memory controller 14, 86 and the memory device 16, 88 as explained above.

Although the present invention has been described with reference to the disclosed embodiments, persons skilled in the art will recognize that changes may be made in form and detail without departing from the spirit and scope of the invention.

We claim:

1. A circuit for generating a strobe signal, comprising:
a delay-lock loop receiving an input clock signal, the delay-lock loop comprising:
a phase detector having first input terminal receiving the input clock signal and second input terminal receiving a feedback clock signal, the phase detector being operable to generate at an output terminal a phase control voltage having a magnitude corresponding to the phase difference between input clock signal and the feedback clock signal; and
a delay line having an input coupled to receive the input clock signal, the delay line outputting a delayed clock signal having a phase relative to the phase of the input clock signal that is controlled by the phase control voltage;
a phase generator circuit coupled to receive the delayed clock signal from the delay line, the phase generator circuit generating a first strobe signal and a second strobe signal from the delayed clock signal, the second strobe signal having a phase offset from the first strobe signal of 90 degrees; and
a feedback path coupling the first strobe signal to the second input of the phase detector as the feedback clock signal.

2. The strobe signal generating circuit of claim 1 wherein the phase generator circuit comprises:
a second phase detector operable to generate a delay control signal corresponding to phase difference between first and second signals coupled to respective inputs of the second phase detector; and
a plurality of delay elements coupled in series from a first delay element to a last delay element, each of the delay elements delaying a signal coupled to its input by a delay that is controlled by the delay control signal, the delayed clock signal being coupled to the first delay element, the first delay element generating the first signal coupled to the first input of the second phase detector, and the last delay element generating the second signal coupled to the second input of the second phase detector so that the phase of the first and second signals are equal to each other and respective phases of second and first strobe signals are generated at the outputs of respective ones of the delay elements.

3. The strobe signal generating circuit of claim 2 wherein the plurality of delay elements comprise eight delay elements generating second and first strobe signals having phases of 0, 45, 90, 135, 180, 225, 270, and 315 degrees, respectively.

* * * * *